(12) United States Patent
Chiu et al.

(10) Patent No.: US 10,199,317 B2
(45) Date of Patent: Feb. 5, 2019

(54) ELECTRONIC PACKAGE

(71) Applicant: Siliconware Precision Industries Co., Ltd., Taichung (TW)

(72) Inventors: Chih-Hsien Chiu, Taichung (TW); Chia-Yang Chen, Taichung (TW); Ying-Wei Lu, Taichung (TW); Jyun-Yuan Jhang, Taichung (TW); Ming-Fan Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 214 days.

(21) Appl. No.: 15/083,421

(22) Filed: Mar. 29, 2016

(65) Prior Publication Data

US 2017/0201023 A1    Jul. 13, 2017

(30) Foreign Application Priority Data

Jan. 11, 2016 (TW) .............................. 105100697 A

(51) Int. Cl.
| | |
|---|---|
| *H01L 23/498* | (2006.01) |
| *H01L 23/66* | (2006.01) |
| *H01Q 9/06* | (2006.01) |
| *H01Q 19/10* | (2006.01) |
| *H01Q 23/00* | (2006.01) |
| *H01Q 1/24* | (2006.01) |

(52) U.S. Cl.
CPC ........ *H01L 23/49838* (2013.01); *H01L 23/66* (2013.01); *H01Q 9/065* (2013.01); *H01Q 19/104* (2013.01); *H01Q 23/00* (2013.01); *H01L 2223/6627* (2013.01); *H01L 2223/6677* (2013.01); *H01Q 1/243* (2013.01)

(58) Field of Classification Search
CPC ...... H01Q 9/065; H01Q 19/104; H01Q 23/00; H01Q 1/243
See application file for complete search history.

(56) References Cited

U.S. PATENT DOCUMENTS

2013/0015544 A1* 1/2013 Han .................... H01L 23/3121
257/428

* cited by examiner

*Primary Examiner* — Graham Smith
(74) *Attorney, Agent, or Firm* — Mintz Levin Cohn Ferris Glovsky and Popeo, P.C.; Peter F Corless; Steven M. Jensen

(57) ABSTRACT

An electronic package includes a circuit structure having a first metal layer, a packaging layer formed on the circuit structure, and a second metal layer formed on the packaging layer and separated from the first metal layer at a distance. The first metal layer and the second metal layer constitute an antenna structure. Since the second metal layer is formed on a portion of a surface of the packaging layer, a propagating wave emitted by the first metal layer cannot pass through the second metal layer, but a surface of the packaging layer not covered by the second metal layer. Therefore, the propagating wave can be transmitted to a predetermined target, and the electronic package performs the function of an antenna.

18 Claims, 5 Drawing Sheets

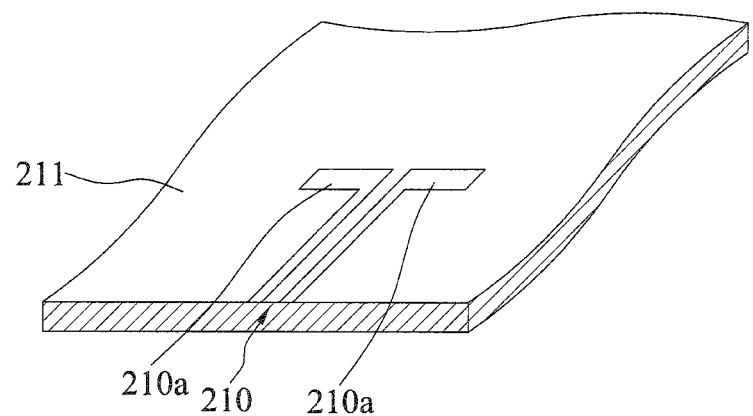
FIG. 2A
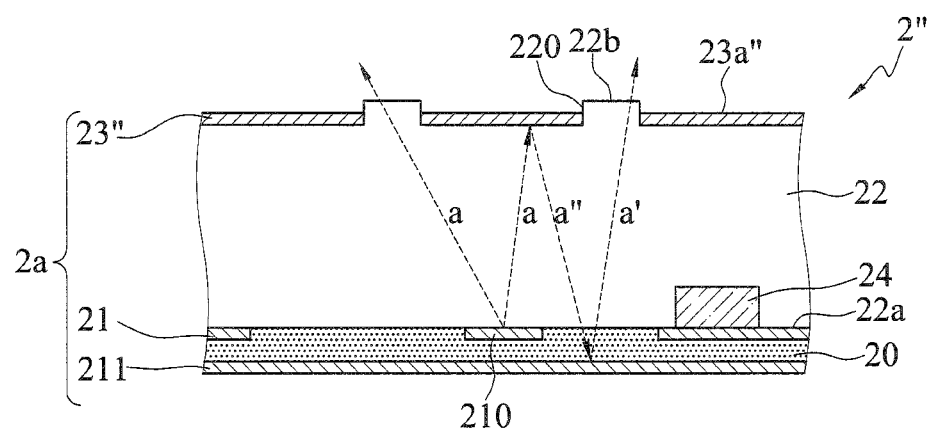
FIG. 2"

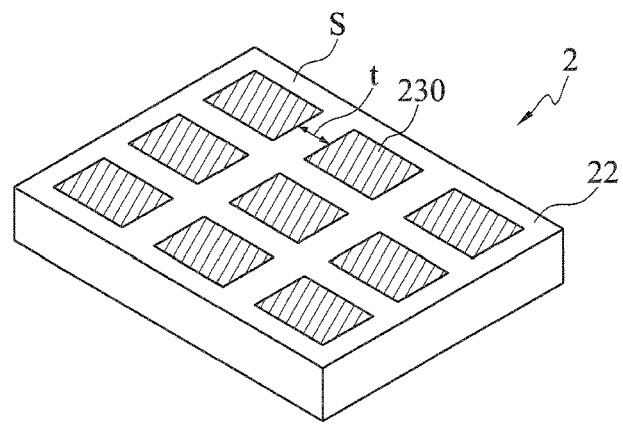
FIG. 3
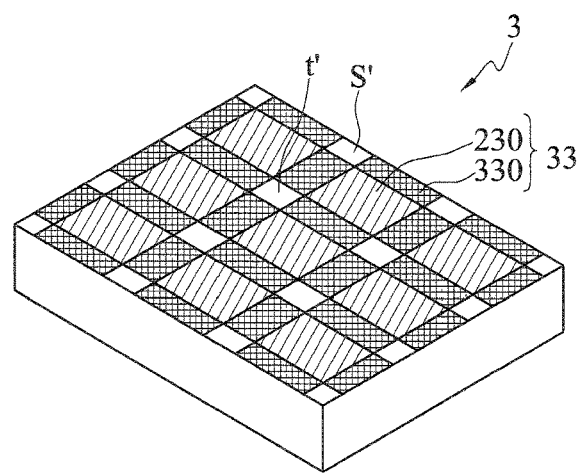
FIG. 3'
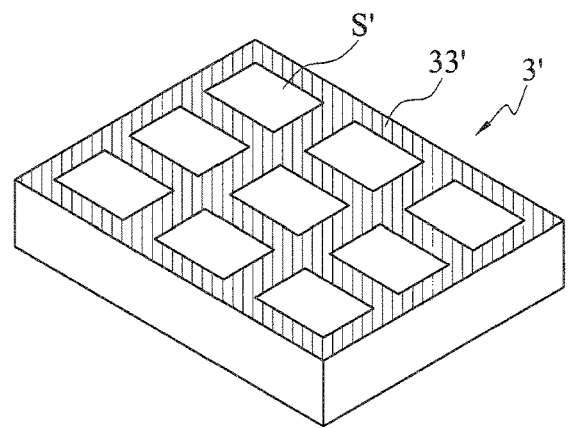
FIG. 3"

ELECTRONIC PACKAGE

CROSS-REFERENCE TO RELATED APPLICATION

This application claims under 35 U.S.C. § 119(a) the benefit of Taiwanese Patent Application No. 105100697, filed Jan. 11, 2016, the entire contents of which are incorporated herein by reference.

BACKGROUND

1. Technical Field

The present disclosure relates to electronic packages, and, more particularly, to an electronic package with an antenna structure.

2. Description of Related Art

With the rapid development of the electronics industry, the trend for electronic products is gradually moving towards multifunction and high performance. Currently, wireless communication technology has been widely used in a variety of consumer electronic products so as to facilitate the reception and transmission of various kinds of wireless signals. In order to meet the aesthetic design needs of consumer electronics products, manufacturing and design of the wireless communication modules are tending towards light, thin and small modules. Among them, patch antennas are pervasively used in the wireless communication modules of the electronic products, such as mobile phones and personal digital assistants (PDAs), owing to its compact size, light weight, and ease of manufacturing in particular.

FIG. 1 is an isometric drawing of a traditional wireless communication module 1. The wireless communication module 1 includes: a packaging substrate 10, a plurality of electronic elements 14, an antenna structure 11 and a molding compound 12. The packaging substrate 10 is a circuit board and is rectangular. The electronic elements 14 are disposed on the packaging substrate 10 and electrically connected with the packaging substrate 10. The antenna structure 11 is a patch antenna including an antenna body 110 and a conductor 111. The antenna body 110 is electrically connected with one of the electronic elements 14 via the conductor 111. The molding compound 12 covers the electronic elements 14 and a portion of the conductor 111.

However, in the traditional wireless communication module 1, as the antenna structure 11 is a flat-type antenna, the electromagnetic radiation between the antenna structure 11 and the electronic elements 14 and the size constraint of the antenna structure 11 mean that the antenna body 110 cannot be integrally manufactured with the electronic elements 14. Therefore, the molding compound 12 only covers the electronic elements 14, but not the antenna body 110. As a result, the die used in the packaging process needs to accommodate the layout area of the electronic elements 14 instead of the size of the packaging substrate 10, which is not favorable for the packaging process.

Moreover, since the antenna structure 11 is a flat-type antenna, additional layout area needs to be provided on the surface of the packaging substrate 10 (where the molding compound 12 is not formed) to accommodate the antenna body 110, so the width of the packaging substrate 10 cannot be minimized, which in turn makes it difficult to reduce the width of the wireless communication module 1 and satisfy the need for a compact wireless communication module 1.

Therefore, there is a need for a solution that addresses the aforementioned issues in the prior art.

SUMMARY

In view of the aforementioned shortcomings of the prior art, the present disclosure provides an electronic package, which may include: a circuit structure having a first metal layer configured to carry a source for a propagating wave or provide emission or reflection of a propagating wave; a packaging layer formed on the circuit structure, wherein the packaging layer includes a first surface and a second surface opposite to the first surface, such that the packaging layer is coupled with the circuit structure via the first surface, and wherein a leakage area and a reflective area are defined on the second surface of the packaging layer; and at least a second metal layer formed on the reflective area of the second surface of the packaging layer and separated from the first metal layer at a distance, wherein the first metal layer and the second metal layer constitute an antenna structure.

In an embodiment, the circuit structure may further include a ground layer, and the ground layer and the first metal layer are provided on the same layer or different layers of the circuit structure.

In an embodiment, the first metal layer is embedded in the circuit structure or in contact with the packaging layer.

In an embodiment, the leakage area of the packaging layer is defined as an area of the second surface not covered with the second metal layer, allowing the propagating wave emitted by the first metal layer to directly pass therethrough or allowing the propagating wave reflected by the second metal layer and the first metal layer once or multiple times to pass therethrough.

In an embodiment, the second metal layer is configured to reflect the propagating wave, or reflecting the propagative wave reflected once or multiple times by the first metal layer.

In an embodiment, the second metal layer includes a plurality of metal sheets with gaps formed therebetween, such that the gaps are disposed on the leakage area. For example, the second metal layer may further include an extension portion connected with the metal sheets, and the metal sheets and the extension portion form a frame.

In an embodiment, the second metal layer protrudes from the second surface of the packaging layer. In another embodiment, the second metal layer is not protruded from the second surface of the packaging layer.

In an embodiment, the electronic package may further include an electronic element on the circuit structure, and the packaging layer covers the electronic element.

In an embodiment, the electronic package may further include an insulating layer formed on the second surface of the packaging layer and covering the second metal layer.

It can be known from the above that in the electronic packages of the present disclosure, with the formation of a reflective area on the second surface of the second metal layer, propagating waves emitted by the first metal layer and propagating waves reflected by the second metal layer and the first metal layer once or multiple times can only pass through the leakage area but not the second metal layer, thereby creating a resonant cavity structure, which adjusts each leakage wave passing through the leakage area to the same phase, and forming constructive interference and yielding a high-gain antenna.

Moreover, by providing the first metal layer and the second metal layer on the two respective opposing surfaces of the packaging layer, during the manufacturing process, the layout area of the antenna structure is capable of corresponding to the area of the packaging layer, so that the molding die of the packaging process is capable of corresponding to the dimension of the circuit structure. This is desirable for the packaging process.

Furthermore, since the antenna structure is formed on the area corresponding to the packaging, there is no need to provide an additional layout area on the surface of the circuit structure. Compared to the prior art, the circuit structure according to the present disclosure is narrower, thereby effectively reducing the width of the electronic package and satisfying the demand for miniaturized electronic packages.

BRIEF DESCRIPTION OF THE DRAWINGS

The present disclosure can be more fully understood by reading the following detailed description of the preferred embodiments, with reference made to the accompanying drawings, wherein:

FIGS. 2' and 2" are alternative embodiments of FIG. 2;

FIG. 2A is a partial isometric view of FIG. 2';

FIG. 3 is an isometric drawing of FIG. 2;

FIGS. 3' and 3" are alternative embodiments of FIG. 3;

DETAILED DESCRIPTION OF THE EMBODIMENTS

Figure 1:
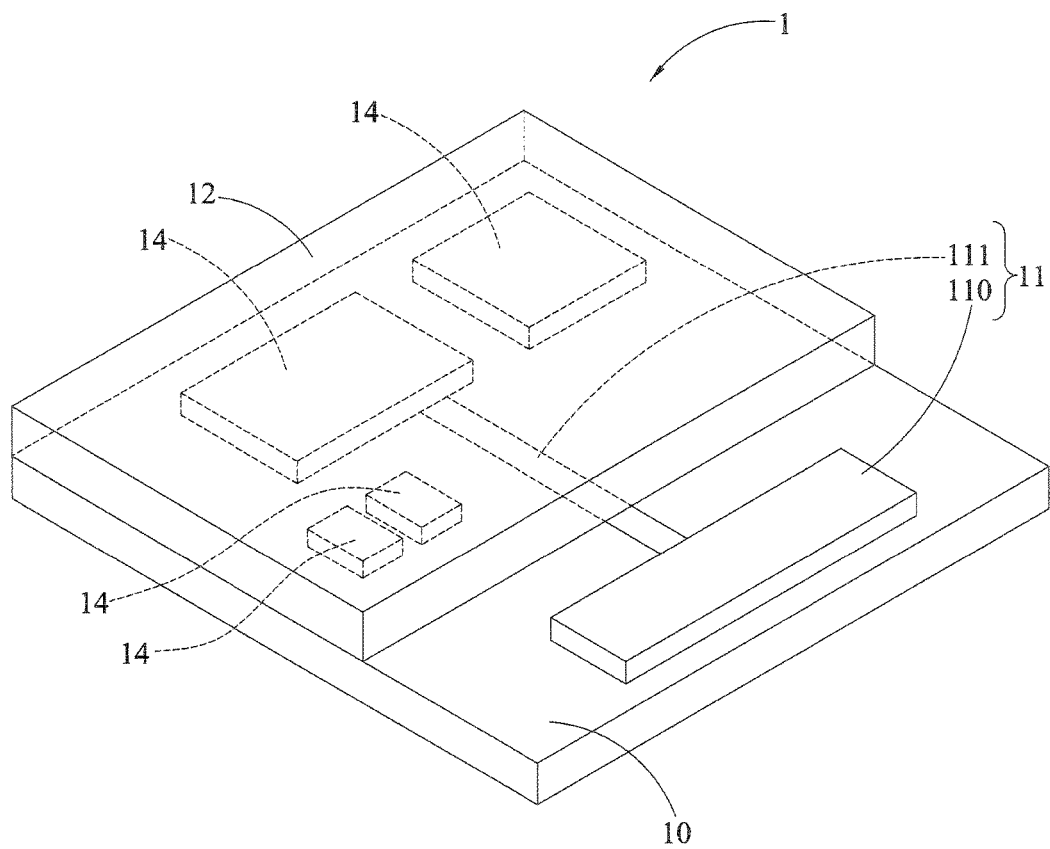
FIG. 1 is an isometric drawing of a traditional wireless communication module.

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "up", "down", "bottom", "first", "second", "a" and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2:
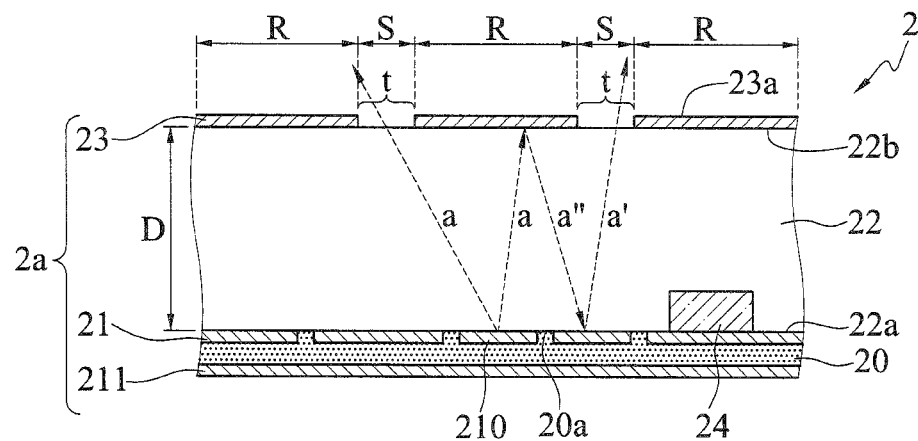
FIG. 2 is a cross-sectional view of an electronic package in accordance with the present disclosure.
Figure 2:
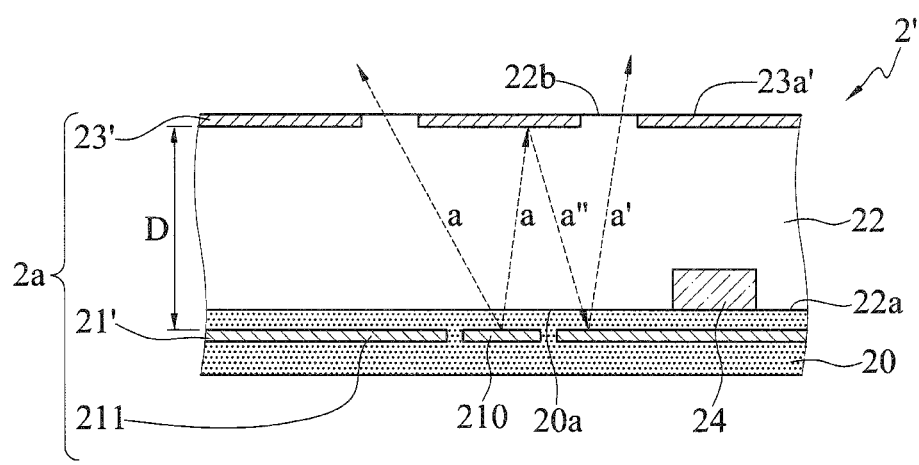

FIGS. 2 and 3 are drawings depicting an electronic package 2 in accordance with the present disclosure. The electronic package 2 includes at least a circuit structure 20, a first metal layer 21, a packaging layer 22, a second metal layer 23 and a ground layer 211.

In an embodiment, the electronic package 2 is a System-in-Package (SiP) wireless communication module.

The circuit structure 20 comprises at least one circuit layer (not shown). The circuit structure 20 is provided with at least one electronic element 24 thereon that is electrically connected to the circuit layer.

In an embodiment, the electronic element 24 is an active element, a passive element or a combination thereof. An active element can be, for example, a semiconductor chip, and a passive element can be a resistor, a capacitor, an inductor or the like.

Moreover, it should be understood that there are many different kinds of circuit structure 20, and the present disclosure is not limited to that shown.

In an embodiment, the first metal layer 21 is a metal material with at least one radiation portion 210 for emitting a propagating wave a.

In an embodiment, the first metal layer 21 is formed on the circuit structure 20 and exposed from a surface 20a of the circuit structure 20. In another embodiment, as shown in the electronic package 2' of FIG. 2', a first metal layer 21' is embedded in the circuit structure 20 and is not exposed from the surface 20a of the circuit structure 20.

Also, the radiation portion 210 is a dipole with slots 210a for generating a radiation source as shown in FIG. 2A. However, there are many different kinds of radiation portion 210, and the present disclosure is not limited thereto.

The ground layer 211 is a metal layer and is coupled with the circuit structure 20. In an embodiment, the first metal layer 21 and the ground layer 211 are at different layers of the circuit structure 20, e.g., upper and lower layers in FIG. 2.

In another embodiment, the first metal layer 21' (or the radiation portion 210) and the ground layer 211 are provided in the same layer of the circuit structure 20, such as those shown in FIGS. 2' and 2A.

The packaging layer 22 is formed on the circuit structure 20 for encapsulating the electronic element 24 and covering the first metal layers 21 and 21'.

In an embodiment, the packaging layer 22 includes a first surface 22a and a second surface 22b opposite to the first surface 22a. The packaging layer 22 is coupled with the circuit structure 20 at the first surface 22a, and a plurality of leakage areas S and a plurality of reflective areas R are defined on the second surface 22b of the packaging layer 22.

In an embodiment, the packaging layer 22 is in contact with the first metal layer 21, as shown in FIG. 2. In another embodiment, the packaging layer 22 is not in contact with the first metal layer 21', as shown in FIG. 2'.

In an embodiment, the leakage areas S are defined as the areas of the second surface 22b that are not covered by the second metal layer 23, and the reflective areas R are defined as the areas of the second surface 22b that are covered by the second metal layer 23.

In an embodiment, the packaging layer 22 is formed of an insulating material, such as polyimide (PI), a dry film, an epoxy or a molding compound.

The second metal layer 23 is formed on the reflective areas R of the second surface 22b of the packaging layer 22. The second metal layer 23 and the first metal layer 21 are separated by at least a distance D, such that the first metal layer 21, the second metal layer 23 and the ground layer 211 form an antenna structure 2a.

In an embodiment, the second metal layer 23 is used as a partially reflective surface (PRS) of the antenna structure 2a for reflecting the propagating wave a" (that is, for reflecting a propagating wave a" being reflected once or multiple times by the first metal layer 21), and the distance D between the second metal layer 23 and the first metal layer 21 is related to the wavelength of the propagating wave. For example, the distance D can be from $\lambda/2$ to $\lambda/32$, where $\lambda$ is the equivalent wavelength of the propagating wave inside the packaging body.

In an embodiment, the second metal layer 23 includes a plurality of metal sheets 230, shown in FIG. 3 as rectangular sheets, and gaps t are formed between the metal sheets 230. These gaps t are disposed on the leakage areas S.

Further, a surface 23a of the second metal layer 23 protrudes from the second surface 22b of the packaging layer 22, as shown in FIG. 2.

In an embodiment, the second metal layers 23' and 23" do not protrude from the second surface 22b of the packaging layer 22, as the electronic package 2' and 2" shown in FIGS. 2' and 2". In an embodiment, the second metal layers 23' or 23" is embedded in the packaging layer 22 and is not exposed from the second surface 22b of the packaging layer 22. As shown in FIG. 2', the surface 23a' of the second metal layer 23' is flush with the second surface 22b of the packaging layer 22. In another embodiment, as shown in FIG. 2", the surface 23a' of the second metal layer 23' is lower than the second surface 22b of the packaging layer 22. Therefore, during the manufacturing process, a plurality of grooves 220 can be formed on the second surface 22b of the packaging layer 22, and a metal material is formed in the grooves 220 as the second metal layer 23' or 23" by sputtering coating, plating, spray coating, printing or the like.

However, in other embodiments, the second metal layer 23 can be pre-fabricated from a metal plate or a metal frame, and these pre-fabricated portions are then directly adhered onto the second surface 22b of the packaging layer 22.

When the antenna structure 2a of the electronic package 2, 2', or 2" according to the present disclosure is in operation, the propagating wave a emitted from the first metal layer 21 or 21' and the propagating wave a' reflected by the second metal layer 23 and the first metal layer 21 or 21' once or multiple times can only pass through the leakage areas S, but not the second metal layer 23, 23' or 23", so the signals of the electronic package 2, 2' or 2" can be transmitted to a predetermined target.

For example, the propagating wave a emitted by the radiation portion 210 of the first metal layer 21 or 21' directly passes through a leakage area S, as shown in FIG. 2. Alternatively, the propagating wave a" is reflected from the second metal layer 23 to another portion of the first metal layer 21, and is then reflected by the first metal layer 21, so the propagating wave a' passes through a leakage area S, as shown in FIG. 2. Alternatively, the propagating wave a" is reflected by the ground layer 211, so the propagating wave a' passes through a leakage area S, as shown in FIG. 2". Alternatively, the propagating wave is reflected several times before passing through a leakage area S. The propagating wave a' is a leakage propagating wave of the propagating wave a after being reflected once or multiple times by the second metal layer 23 and the first metal layer 21 or 21', and the propagating wave a" is a cavity reflective wave of the propagating wave a after being reflected once or multiple times by the second metal layer 23 and the first metal layer 21 or 21'.

Therefore, with the design of the first metal layer 21 or 21' and the second metal layer 23, 23' or 23", the propagating wave a emitted by the first metal layer 21 or 21' and the propagating wave a' reflected by the second metal layer 23, 23' or 23" and the first metal layer 21 or 21' once or multiple times can only pass through the leakage areas S, but not the second metal layer 23, 23' or 23" on the reflective areas R. The packaging layer 22 also acts as a resonant cavity of the waves, thereby forming a resonant cavity structure, so that every propagating wave a or a' passing through the leakage areas S are adjusted to the same phase. This creates a constructive interference, and the waves will not cancel each other out, forming a high gain antenna.

In addition, in the electronic package 2, 2' or 2" according to the present disclosure a three-dimensional antenna structure 2a is formed on the two opposite sides of the packaging layer 22, that is, the first metal layer 21 or 21' (or the ground layer 211) and the second metal layer 23, 23' or 23" are formed on the first surface 22a and the second surface 22b of the packaging layer 22, respectively. As a result, during the manufacturing process, the layout area of the antenna structure 2a corresponds to that of the packaging layer 22, so the molding die used in the packing process is able to correspond to the dimension of the circuit structure 20. This is favorable for the packing process.

Moreover, since the first metal layer 21 or 21' (or the ground layer 211) and the second metal layer 23, 23' or 23" are formed on the first surface 22a and the second surface 22b of the packaging layer 22, respectively and a three-dimensional antenna is thus formed, the antenna structure 2a is laid out on the same area of the circuit structure 20 for forming the packaging layer 22, there is no need to provide additional layout area on the surface 20a of the circuit structure 20. Compared with the prior art, the circuit structure 20 according to the present disclosure is narrower, thus effectively reducing the width of the electronic package 2, 2' or 2", and satisfying the demand for a miniaturized electronic package 2, 2' or 2".

In another embodiment, as shown by the electronic package 3 in FIG. 3, the second metal layer 33 further includes a plurality of extension portions 330 electrically connected with the metal sheets 230, allowing the metal sheets 230 and the extension portions 330 to form a frame, and the leakage areas S' (or the gaps t') are in the openings confined by the frame formed from the metal sheets 230 and the extension portions 330. As a result, the first metal layer 21, the second metal layer 33 and these gaps t' (or the leakage areas S') constitute an antenna structure. Moreover, the metal sheets 230 and the extension portions 330 can be made of the same material, such that they can be integrally manufactured to become the second metal layer 33. It can be understood that the location and the dimension of the leakage areas S' can be modified or adjusted depending on the needs, as shown by the electronic package 3' and its second metal layer 33' in FIG. 3".

Figure 4:
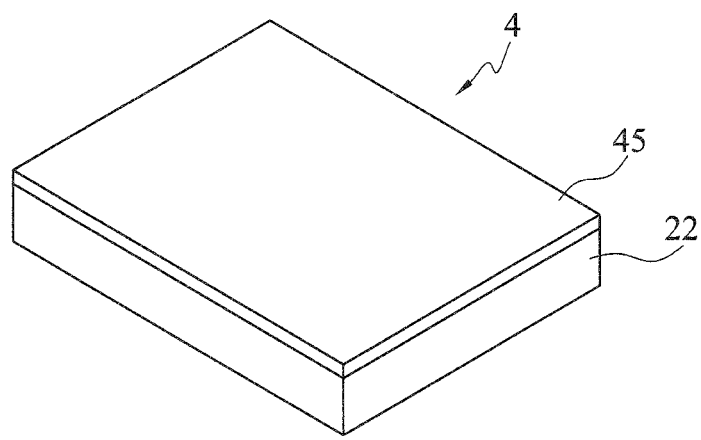
FIG. 4 is another embodiment of FIGS. 3, 3' and 3"

Furthermore, in the embodiments mentioned above, an insulating layer 45 can be further formed on the second surface 22b of the packaging layer 22 so as to cover the second metal layer 23, 23', 23' or 33 (and the extension portions 330) and in the gaps t or t', as shown by the electronic package 4 of FIG. 4. In an embodiment, the insulating layer 45 is made of an insulating material, such as polyimide (PI), a dry film, an epoxy or a molding compound. The insulating layer 45 and the packaging layer 22 can be made of the same or different materials.

In an embodiment, the metal sheets 230 and the leakage areas S' (or the gaps t') may assume in other shapes, such as circle, triangle, trapezium, irregular shapes or other geometric shapes.

Figure 5:
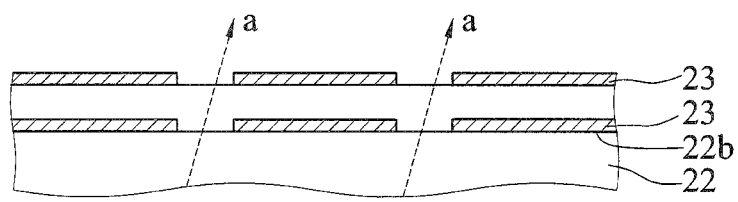
FIG. 5 is another embodiment of FIGS. 2, 2' and 2".

In an embodiment, the second metal layer 23 may include a plurality of layers, as shown in FIG. 5.

In the electronic packages according to the present disclosure, with the formation of reflective areas on the second surface of the second metal layer, propagating waves emitted by the first metal layer and propagating waves reflected by the second metal layer and the first metal layer once or multiple times can only pass through the leakage areas but not the second metal layer, creating a resonant cavity structure, and in turn, a high-gain antenna.

Moreover, using a three-dimensional antenna structure to replace a traditional flat-type antenna structure, the antenna structure can be laid out on top of the packaging layer on the circuit structure, thus reducing the width of the electronic package and achieving the goal of miniaturization.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. An electronic package, comprising:
    a circuit structure including a first metal layer configured to carry a source for a propagating wave or provide emission or reflection of a propagating wave;
    a packaging layer formed on the circuit structure, the packaging layer including a first surface and a second surface opposite to the first surface and coupled with the circuit structure via the first surface of the packaging layer, wherein a leakage area and a reflective area are defined on the second surface of the packaging layer; and
    at least a second metal layer formed on the reflective area of the second surface of the packaging layer and separated from the first metal layer at a distance within a range of from $\lambda/32$ to $\lambda/2$,
    wherein the first metal layer and the second metal layer constitute an antenna structure.

2. The electronic package of claim 1, wherein the circuit structure further includes a ground layer, and the ground layer and the first metal layer are provided on the same layer of the circuit structure.

3. The electronic package of claim 1, wherein the circuit structure further includes a ground layer, and the ground layer and the first metal layer are provided on different layers of the circuit structure.

4. The electronic package of claim 1, wherein the first metal layer is in contact with the packaging layer.

5. The electronic package of claim 1, wherein the leakage area of the packaging layer is defined as an area of the second surface not covered with the second metal layer, allowing the propagating wave emitted by the first metal layer to directly pass therethrough.

6. The electronic package of claim 1, wherein the second metal layer is configured to reflect the propagating wave.

7. The electronic package of claim 6, wherein the leakage area of the packaging layer is defined as an area of the second surface not covered with the second metal layer, allowing the propagating wave reflected by the second metal layer and the first metal layer once to pass therethrough.

8. The electronic package of claim 6, wherein the leakage area of the packaging layer is defined as an area of the second surface not covered with the second metal layer, allowing the propagating wave reflected by the second metal layer and the first metal layer multiple times to pass therethrough.

9. The electronic package of claim 1, wherein the second metal layer includes a plurality of metal sheets with gaps formed therebetween.

10. The electronic package of claim 9, wherein the gaps are formed on the leakage area.

11. The electronic package of claim 9, wherein the second metal layer further includes an extension portion connected with the metal sheets.

12. The electronic package of claim 11, wherein the metal sheets and the extension portion form a frame.

13. The electronic package of claim 1, wherein the second metal layer protrudes from the second surface of the packaging layer.

14. The electronic package of claim 1, wherein the second metal layer is free from protruding from the second surface of the packaging layer.

15. The electronic package of claim 1, further comprising an electronic element disposed on the circuit structure.

16. The electronic package of claim 15, wherein the electronic element is covered by the packaging layer.

17. The electronic package of claim 1, further comprising an insulating layer formed on the second surface of the packaging layer and covering the second metal layer.

18. The electronic package of claim 1, wherein the first metal layer is embedded in the circuit structure.

* * * * *